(12) United States Patent
Su et al.

(10) Patent No.: US 10,570,910 B2
(45) Date of Patent: Feb. 25, 2020

(54) METHOD AND DEVICE FOR ADJUSTING OPERATION DATA

(71) Applicants: Beijing Smartmi Technology Co., Ltd., Beijing (CN); Xiaomi Inc., Beijing (CN)

(72) Inventors: Jun Su, Beijing (CN); Mengnan Wang, Beijing (CN); Yongfeng Xia, Beijing (CN); Yi Wang, Beijing (CN)

(73) Assignees: BEIJING SMARTMI TECHNOLOGY CO., LTD., Beijing (CN); XIAOMI INC., Beijing (CN)

(*) Notice: Subject to any disclaimer, the term of this patent is extended or adjusted under 35 U.S.C. 154(b) by 163 days.

(21) Appl. No.: 15/665,687

(22) Filed: Aug. 1, 2017

(65) Prior Publication Data

US 2017/0328371 A1 Nov. 16, 2017

Related U.S. Application Data

(63) Continuation of application No. PCT/CN2016/084960, filed on Jun. 6, 2016.

(30) Foreign Application Priority Data

Jun. 12, 2015 (CN) .......................... 2015 1 0325484

(51) Int. Cl.
*F24F 11/00* (2018.01)
*F04D 27/00* (2006.01)
(Continued)

(52) U.S. Cl.
CPC ............ *F04D 27/004* (2013.01); *F24F 11/77* (2018.01); *F24F 11/79* (2018.01); *H05K 7/20209* (2013.01)

(58) Field of Classification Search
CPC ............ F24F 11/00; F24F 11/77; F24F 11/79
See application file for complete search history.

(56) References Cited

U.S. PATENT DOCUMENTS

2006/0184283 A1* 8/2006 Lee .......................... F24F 11/30
  700/276
2010/0121494 A1   5/2010 Ma et al.
(Continued)

FOREIGN PATENT DOCUMENTS

CN        10103382 A    9/2007
CN       103032935 A    4/2013
(Continued)

OTHER PUBLICATIONS

Extended European Search Report dated May 9, 2018 for European Application No. 16806788.2, 8 pages.
(Continued)

*Primary Examiner* — Jonathan Bradford
(74) *Attorney, Agent, or Firm* — Brinks Gilson & Lione

(57) ABSTRACT

The present disclosure relates to a method and device for adjusting operation data of an air-out device. The method may involve presenting an operation data adjustment interface for adjusting the operation parameter of the air-out device in response to a user selection of the interaction element for adjusting the operation parameter of the air-out device, obtaining an adjusted operation parameter of the air-out device, generating an adjusted operation data file based on the adjusted operation parameter that is obtained, and transmitting the adjusted operation data file to the air-out device.

16 Claims, 16 Drawing Sheets

(51) Int. Cl.
*F24F 11/77* (2018.01)
*F24F 11/79* (2018.01)
*H05K 7/20* (2006.01)

(56) References Cited

U.S. PATENT DOCUMENTS

| | | | |
|---|---|---|---|
| 2011/0202179 A1* | 8/2011 | Franzolin | G05D 23/1951 |
| | | | 700/275 |
| 2012/0101647 A1 | 4/2012 | Laflamme et al. | |
| 2014/0044558 A1 | 1/2014 | Eden | |
| 2014/0206274 A1 | 7/2014 | Hrejsa et al. | |
| 2014/0227085 A1 | 8/2014 | Yu | |
| 2014/0371921 A1* | 12/2014 | Weaver | H02J 3/14 |
| | | | 700/276 |
| 2016/0010888 A1* | 1/2016 | Groskreutz | F24F 11/30 |
| | | | 236/1 C |

FOREIGN PATENT DOCUMENTS

| | | |
|---|---|---|
| CN | 103905871 A | 7/2014 |
| CN | 104236026 A | 12/2014 |
| CN | 104596035 A | 5/2015 |
| CN | 105090081 A | 11/2015 |
| EP | 2 241 836 A1 | 10/2010 |
| EP | 2 180 267 A3 | 8/2011 |
| EP | 2 604 939 A1 | 6/2013 |
| JP | 02-021149 A | 1/1990 |
| JP | 04-116325 A | 4/1992 |
| JP | 2003-240317 A | 8/2003 |
| JP | 2003-287266 A | 10/2003 |
| JP | 2004-028529 A | 1/2004 |
| JP | 2005-147436 A | 6/2005 |
| JP | 2013-076493 A | 4/2013 |
| JP | 2014-035095 A | 2/2014 |
| JP | 2014-137155 A | 7/2014 |
| JP | 2016-125687 A | 7/2016 |
| RU | 2007 108 788 A | 9/2008 |
| RU | 2009 149 602 A | 7/2011 |

OTHER PUBLICATIONS

Office Action dated May 25, 2016 for Chinese Application No. 201510325484.1, 9 pages.
Office Action dated Jul. 18, 2017 for Japanese Application No. 2016-549713, 7 pages.
Office Action dated Aug. 30, 2017 for Korean Application No. 10-2016-7021495, 13 pages.
Office Action dated Jul. 31, 2017 for Russian Application No. 2016131881/12, 8 pages.
Decision to Grant dated Feb. 27, 2018 for Russian Application No. 2016131881/12, 19 pages.
International Search Report to PCT Application No. PCT/CN2016/084960 dated Sep. 12, 2016 and English Translation (7p).

* cited by examiner

METHOD AND DEVICE FOR ADJUSTING OPERATION DATA

CROSS-REFERENCE TO RELATED APPLICATIONS

This application is a continuation of International Application No. PCT/CN2016/084960, filed Jun. 6, 2016, which is based upon and claims priority to Chinese Patent Application 201510325484.1, filed Jun. 12, 2015, the entire contents of which are incorporated herein by reference.

TECHNICAL FIELD

The present disclosure generally relates to information processing technologies, and more particularly, to a method and device for adjusting operation data of an air-out device.

BACKGROUND

Given recent improvements in living standards, air-out devices (e.g., air-out devices like fans, air conditioners, air-coolers, or the like) have become common home appliances, enjoying wide use by more and more users. The operation of these air-out devices may be adjusted as needed, for example, by adjusting operation data for the air-out devices, and it may be possible to adjust the air speed and the angle indicating wind direction of these devices. For example, the operation data may be adjusted periodically using a preset controller/timer so that the air-out devices can output air periodically in accordance with the operation data. As a more specific example, the preset controller/timer may direct the air-out device to run at a low speed when started, at a high speed after five minutes, at a low speed after another five minutes, and then stop. According to the settings of the controller/timer, the operation data of the air-out device is periodically adjusted, which causes air to be output as just described.

SUMMARY

Embodiments of the present disclosure provide a method and device for adjusting the operation parameters of an air-out device in order to provide a user with a rich sensory experience.

It is to be understood that both the foregoing general description and the following detailed description are exemplary and explanatory only and are not restrictive of the invention.

BRIEF DESCRIPTION OF THE DRAWINGS

The accompanying drawings, which are incorporated in and constitute a part of this specification, illustrate embodiments consistent with the invention and, together with the description, serve to explain the principles of the invention.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of devices and methods consistent with aspects related to the invention as recited in the appended claims.

Figure 1:
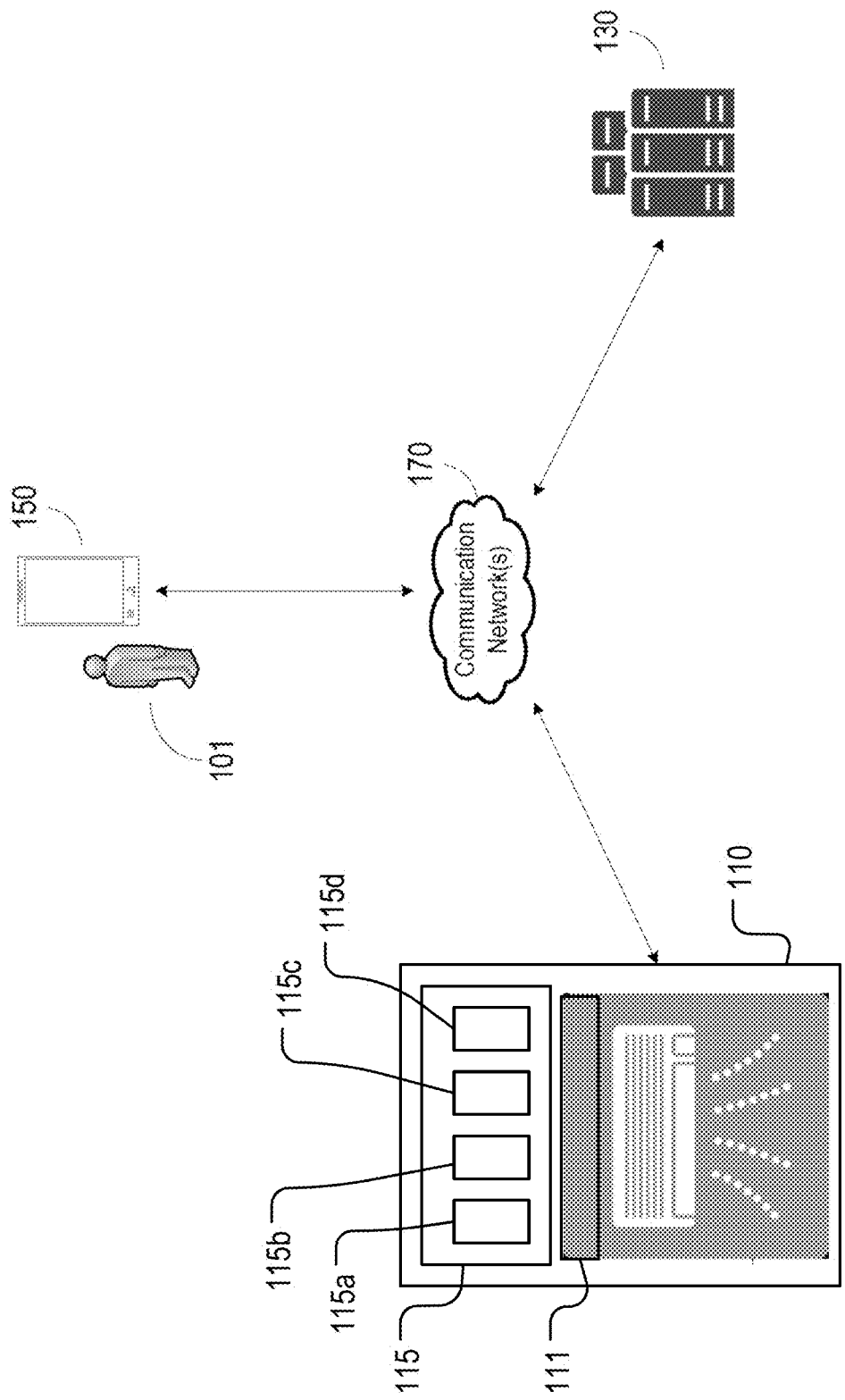
FIG. 1 illustrates an example of a system environment in which different devices may interact.

FIG. 1 illustrates an example of a system environment in which different devices may interact. The system environment 100 may include a terminal device 150, which may be operated by a user 101, an air-out device 110 (e.g., a fan, air conditioner, air cooler, or the like), and one or more information servers 130.

The air-out device 110 may control air flow within a particular environment (e.g., a room, a building, etc.), and may do so by accepting incoming air, for example, through an air intake valve, and pushing out outgoing air, for example, through an air exhaust valve. The air-out device 110 may include a device controller 111, which may be responsible for controlling operation of the air-out device 110. The air-out device 110 may also include one or more auxiliary devices 115 that can affect different qualities of the air, which may also be controlled by the device controller 111. By way of example, the auxiliary devices 115 may include a temperature adjustment device 115a, a humidity adjustment device 115b, an oxygen generation device 115c, and or audio and/or video playback device 115d. The temperature adjustment device 115a may be able to adjust the temperature of air accepted through the air intake valve, the humidity adjustment device 115b may be able to adjust the humidity of air accepted through the air intake valve, and the oxygen generation device 115c may be able to adjust the amount of oxygen in, or the oxygen level of, the air accepted through the air intake valve. The auxiliary devices may be used to provide different experiences to the user 101 including, for example, warmth or coolness, visual or aural stimulation, or the like, which can heighten the user's overall experience.

Figure 9:
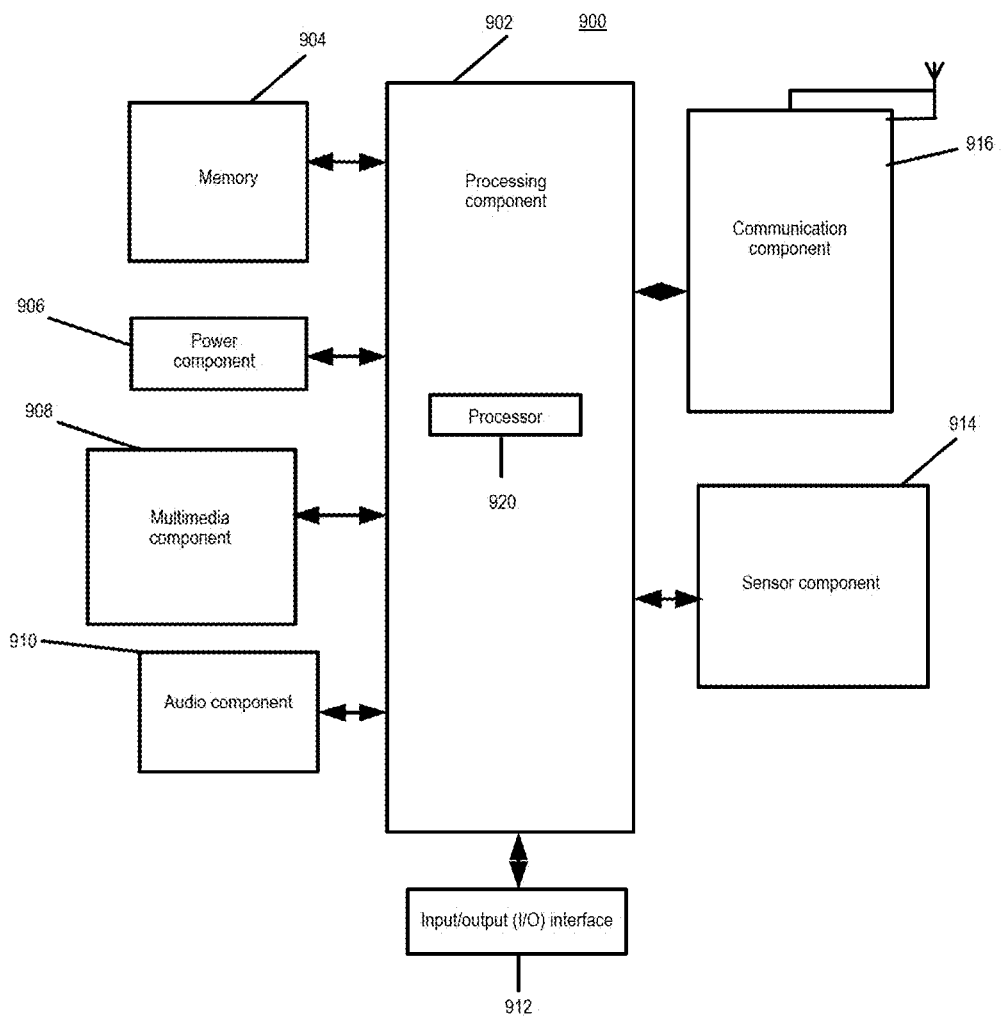
FIG. 9 illustrates an example of a terminal device.

The terminal device 150 may take the form of a mobile phone, a computer, a digital broadcast terminal, a messaging device, a gaming console, a tablet, a medical device, exercise equipment, a personal digital assistant, or the like. FIG. 9 provides an example terminal device 900, which may include one or more of the following components: a processing component 902, a memory 904, a power component 906, a multimedia component 908, an audio component 910, an input/output (I/O) interface 912, a sensor component 914, and a communication component 916.

The processing component 902 may control overall operation of the terminal device 900, such as the operations associated with display, telephone calls, data communications, camera operations, and recording operations. The processing component 902 may include one or more processors 920 to execute instructions to perform all or part of the functionality described in greater detail below. The processing component 902 may also include one or more modules which facilitate the interaction between the processing component 902 and other components. For instance, the processing component 902 may include a multimedia module to facilitate the interaction between the multimedia component 908 and the processing component 902.

The memory 904 may be configured to store various types of data to support operation of the terminal device 900. By way of example, the memory 904 may store application data, including instructions for executing, or otherwise operating, applications on the terminal 900, contact data, phonebook data, messages, pictures, video, etc. The memory 904 may be implemented using any type of volatile or non-volatile memory devices, or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic or optical disk.

The power component 906 may be responsible for providing power to the various other components of the terminal device 900. The power component 906 may include a power management system, one or more power sources, and any other components associated with the generation, management, and distribution of power in the terminal device 900.

The multimedia component 908 may include a screen providing an output interface between the terminal 900 and the user. In some embodiments, the screen may include a liquid crystal display (LCD) and a touch panel (TP). If the screen includes the touch panel, the screen may be implemented as a touch screen to receive input signals from the user. The touch panel may include one or more touch sensors to sense touches, swipes, and gestures on the touch panel. The touch sensors may not only sense a boundary of a touch or swipe action, but also sense a period of time and a pressure associated with the touch or swipe action. In some embodiments, the multimedia component 908 may include a front camera and/or a rear camera. The front camera and the rear camera may receive an external multimedia datum while the terminal 900 is in an operation mode, such as a photographing mode or a video mode. Each of the front camera and the rear camera may be a fixed optical lens system or have focus and optical zoom capability.

The audio component 910 may be configured to output and/or input audio signals. For example, the audio component 910 may include a microphone ("MIC") configured to receive an external audio signal when the terminal 900 is in an operation mode, such as a call mode, a recording mode, and a voice recognition mode. The received audio signal may be further stored in the memory 904 or transmitted via the communication component 916. In some embodiments, the audio component 910 may further include a speaker to output audio signals.

The I/O interface 912 may provide an interface between the processing component 902 and peripheral interface modules, such as a keyboard, a click wheel, buttons, and the like. The buttons may include, but are not limited to, a home button, a volume button, a starting button, and a locking button.

The sensor component 914 may include one or more sensors to provide status assessments of various aspects of the terminal 900. For instance, the sensor component 914 may detect an open/closed status of the terminal 900, relative positioning of components, e.g., the display and the keypad, of the terminal 900, a change in position of the terminal 900 or a component of the terminal 900, a presence or absence of user contact with the terminal 900, an orientation or an acceleration/deceleration of the terminal 900, and/or a change in temperature of the terminal 900. The sensor component 914 may include a proximity sensor configured to detect the presence of nearby objects without any physical contact. The sensor component 914 may also include a light sensor, such as a CMOS or CCD image sensor, for use in imaging applications. In some embodiments, the sensor component 914 may also include an accelerometer sensor, a gyroscope sensor, a magnetic sensor, a pressure sensor, or a temperature sensor.

The communication component 916 may be configured to facilitate communication, wired or wirelessly, between the terminal 900 and other devices. The terminal 900 can access a wireless network based on a communication standard, such as WiFi, 2G, or 3G, or a combination thereof. In one embodiment, the communication component 916 can receive a broadcast signal or broadcast associated information from an external broadcast management system via a broadcast channel. In another embodiment, the communication component 916 may further include a near field communication (NFC) module to facilitate short-range communications. For example, the NFC module may be implemented based on a radio frequency identification (RFID) technology, an infrared data association (IrDA) technology, an ultra-wideband (UWB) technology, a Bluetooth (BT) technology, or other technologies.

In some embodiments, the terminal 900 may be implemented with one or more application specific integrated circuits (ASICs), digital signal processors (DSPs), digital signal processing devices (DSPDs), programmable logic devices (PLDs), field programmable gate arrays (FPGAs), controllers, micro-controllers, microprocessors, or other electronic components, for performing or enabling the functionality described in greater detail below.

The terminal device 150, air-out device 110, and information servers 130 may communicate with one another via one or more communication network(s) 170. The communication network(s) 170 may be a public network, such as the Internet, a private network, such as an intranet, or a combination thereof, and may include intermediate network devices or logic operating according to any communication mediums, protocols, topologies, or standards. The communication networks 170, for example, may include terrestrial networks, including as examples, Ethernet, cable, DSL, Multimedia over Coax Alliance, power line, Ethernet Passive Optical Network (EPON), or Gigabit Passive Optical Network (GPON) networks, cellular networks, including standards-based networks (e.g., 2G, 3G, Universal Mobile Telecommunications System (UMTS), GSM® Association, Long Term Evolution (LTE)™, or more), WiMAX networks, Bluetooth networks, near field communication (NFC) networks, WiFi (including 802.11a/b/g/n/ac or others) networks, WiGig networks, Global Positioning System (GPS) networks, any other networks available at the time of the filing of this application, and/or networks that may be developed in the future.

Operation of the air-out device 110 may be governed by certain operation parameters, which may be defined within an operation data file. The operation parameters, for example, may include an air speed and a wind direction angle. In some embodiments, the operation data file may include additional operation parameters including, for example, a temperature parameter, a moisture parameter, an oxygen parameter, and/or audio or video playback parameters. These additional parameters may be used for controlling operation of one or more auxiliary devices 115. The controller 111 may be able to extract, or otherwise determine, the operation parameters defined in the operation data file, and may operate the air-out device 110, including the auxiliary devices 115, in accordance with the defined operation parameters.

In some embodiments, the operation data file may include region information, for example, in the form of longitude and latitude coordinate information, which may be used to control the operation of one or more auxiliary devices 115. The terminal device 150, for example, may obtain weather information corresponding to the region indicated by the region information, and adjust the operation parameters of the auxiliary devices 115 according to the weather information that is obtained. The weather information, for instance, may indicate the temperature, humidity, and/or oxygen concentration value currently being experienced in a particular region (i.e., the region indicated by the region information). The temperature value may be used to define the temperature parameter sent to the temperature adjustment device 115a; the humidity value may be used to define the moisture parameter sent to the humidity adjustment device 115b; and the oxygen concentration value may be used to define the oxygen parameter sent to the oxygen generation device 115c. In some instances, the region information may also be associated with visual and/or aural conditions. For example, the region indicated by the region information may be a coastal location, and an "ocean wave" soundtrack may be sent to the audio playback device 115d.

In some embodiments, the operation data file may include multiple sets of operation parameters along with conditions under which the operation parameters are to be used. The operation parameters, for example, may be defined for different periods of time. The operation parameters, for example, may be defined for different parts of the day (e.g., morning, afternoon, evening, night) or different intervals of time (e.g., 15-minute, 1-hour, or 3-hour intervals). In this way, the operation data file may be able to provide a dynamic experience to the user 101, which may change over time.

A user 101 may be able to control operation of the air-out device 110 through terminal device 150, for example, by adjusting the operation parameters of the air-out device 110. The terminal device 150, for instance, may include an air-out device control application that can facilitate communication with the air-out device 110 to adjust its operation parameters. The air-out device control application may be able to request different information from the air-out control device 110 and send different commands to initiate certain actions on the air-out device 110. The air-out device control application, for example, may be able to request the current operation parameters being used by the air-out device 110 and/or historical operation parameters that had previously been used by the air-out device 110. The air-out device control application may also request information regarding the number and type of auxiliary devices 115 that are associated with the air-out device 110. The air-out device control application may also be able to send commands to the air-out device 110. The air-out device control application, for example, may be able to send a replacement operation data file to the air-out device 110 and command the air-out device 110 to update its operation parameters, as well as the operation parameters of any associated auxiliary devices 115, based on the provided operation data file.

Figure 2:
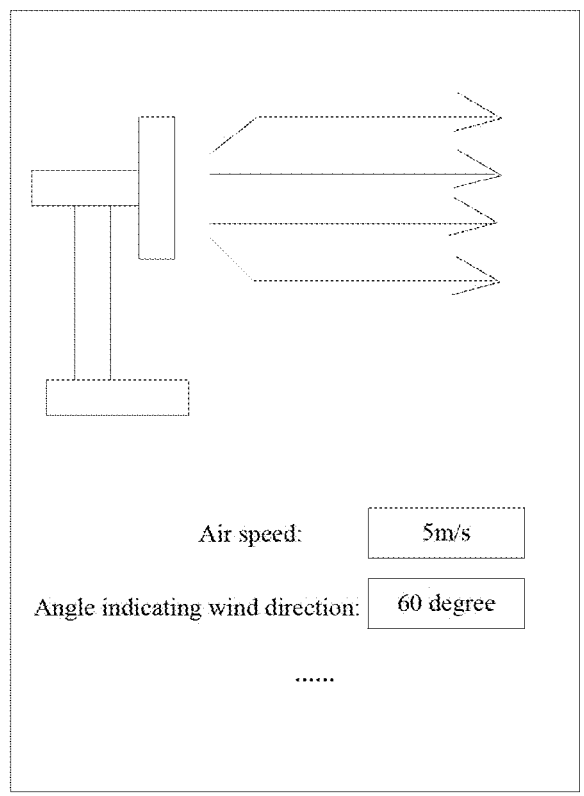
FIG. 2 illustrates a first example of an operation data adjustment interface.

The air-out device control application may also provide different interfaces to the user for controlling operation of the air-out device 110. The air-out device control application, for instance, may provide the user with an operation data adjustment interface through which the user may adjust the operation parameters of the air-out device 110 and any associated auxiliary devices 115. The operation data adjustment interface may allow a user 101 to change, or adjust, operation parameters in different ways. The operation data adjustment interface, for example, may include input boxes for inputting operation parameters for the air-out device 110 and any associated auxiliary devices 115. By way of example, FIG. 2 shows an operation data adjustment interface that includes input boxes for 'Air Speed' and 'Angle of Wind Direction'. The air-out device control application may populate the input boxes of the operation data adjustment interface with the current operation parameter values of the air-out device 110 and any associated auxiliary devices 115, which the air-out device control application may request and receive from the air-out device 110. While the foregoing description was made with reference to particular operation parameters (i.e., air speed and angle of wind direction), the operation data adjustment interface is not thus limited and may allow adjustment of any parameters of the air-out device 110 and the associated auxiliary devices 115 (e.g., temperature parameter, moisture parameter, oxygen concentration parameter, audio and video playback parameters, etc.).

Figure 3:
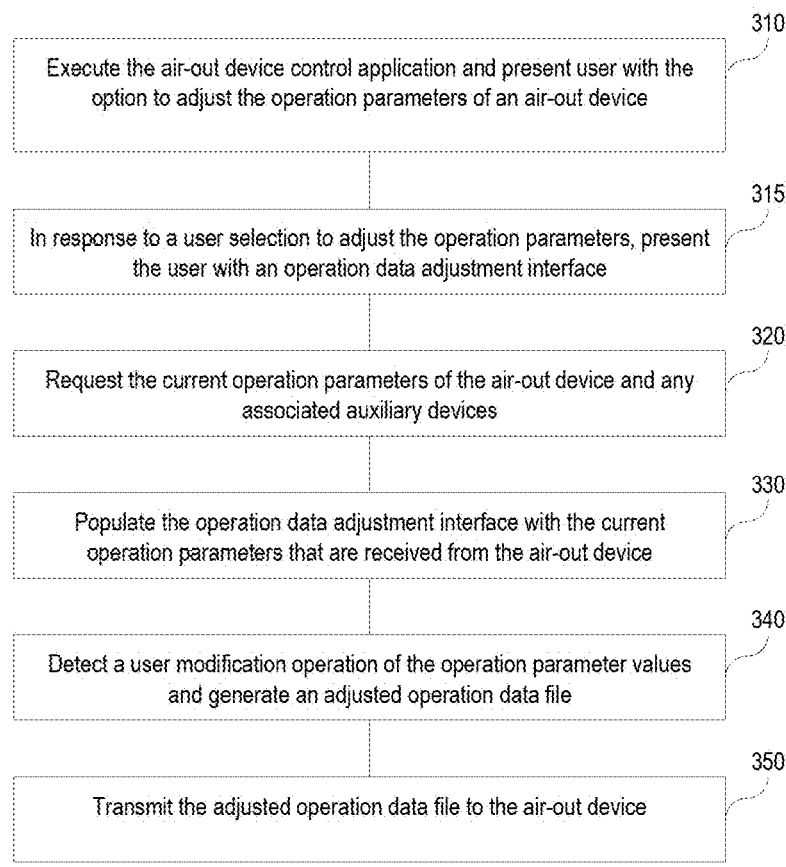
FIG. 3 illustrates an example of the logic that may be employed by a terminal device to facilitate adjustment of the operation parameters of the air-out device.

FIG. 3 illustrates an example of the logic that may be employed by a terminal device 150 to facilitate adjustment of the operation parameters of the air-out device 110. A user 101 may execute the air-out device control application on the terminal device 150, which may present the user with the option to adjust the operation parameters for an air-out device 110 (310). In response to a user selection to adjust the operation parameters, the terminal device 150 may present the user 101 with an operation data adjustment interface (315), which the user 101 can interact with to adjust the operation parameters of the air-out device 110. The air-out device control application may also request the current operation parameters of the air-out device 110 and any associated auxiliary devices 115 (320). The air-out device control application may use the current operation parameters that are received from the air-out device 110 to populate the operation data adjustment interface (330). With reference to FIG. 2, for example, the operation data adjustment interface includes 'Air Speed' and 'Angle of Wind Direction' input boxes, which are populated with the current operation parameters of the air-out device 110, i.e., an air speed of 5 m/s and an angle of wind direction of 60 degrees. The user may be able to modify the values in the various fields of the operation data adjustment interface based on their own requirements. If a modification operation is detected (i.e., the value of one or more input fields is changed), the air-out device control application may generate an adjusted operation data file (340). The adjusted operation data file may be sent to the air-out device 110 automatically or based on a user input received through the operation data adjustment interface (e.g., based on user selection of a 'Send to Device' button) (350).

In some embodiments, the operation data adjustment interface may present the user 101 with a visual model of the operation parameters for the air-out device 110, which the user 101 may manipulate through the operation data adjustment interface to adjust the operation parameters of the air-out device 110. In some embodiments, for example, the operation data adjustment interface may display historical operation parameters of the air-out device 110 in the form of one or more graphs or charts, where a first axis (e.g., the horizontal axis) represents time and a second axis (e.g., the vertical axis) represents the operation parameter value. In doing so, the air-out device control application may request the historical operation parameters from the air-out device 110. The period of time covered by the chart may vary (e.g., covering a 30-minute, 1-hour, or 3-hour). In some embodiments, the time period may be specified by the user 101, where the maximum time period is limited by the period for which the air-out device 110 is able to provide historical data (i.e., the amount of historical operation parameters stored or buffered on the air-out device 110).

The historical operation parameters received in response to the request may be plotted as a curve on a graph. Depending on the implementation, each of the operation parameters may be presented to the user as a separate model (i.e., individual graphs for each operation parameter) or as a single model (i.e., a single graph with each curve representing a different operation parameter). In some cases, a single graph may be presented to the user 101, who may be able to select and/or switch between the operation parameter that is displayed on the graph, for example, by selecting a particular operation parameter from a drop-down list provided in the operation data adjustment interface. The scale and unit of measure for the axes may be adjusted to correspond to the operation parameter that is being displayed (e.g., switching the vertical axis from m/s to degrees depending on whether the air speed or angle of wind direction is selected for display). Where multiple operation parameters are displayed on a single graph, the axes may represent several units of measure at different scales. Once the historical operation parameters have been plotted as a curve, the user 101 may be able to modify the trajectory of the curve through the operation data adjustment interface. The user 101, for example, may be able to adjust the trajectory of the curve by performing a sliding operation or a tapping operation, which may define a modified curve in a pointwise manner. Based on the trajectory of the modified curve, an updated set of operation parameters can be determined. The updated operation parameters may be used to generate an adjusted operation data file, which may, in turn, be sent to the air-out device 110, as described above.

Figure 4:
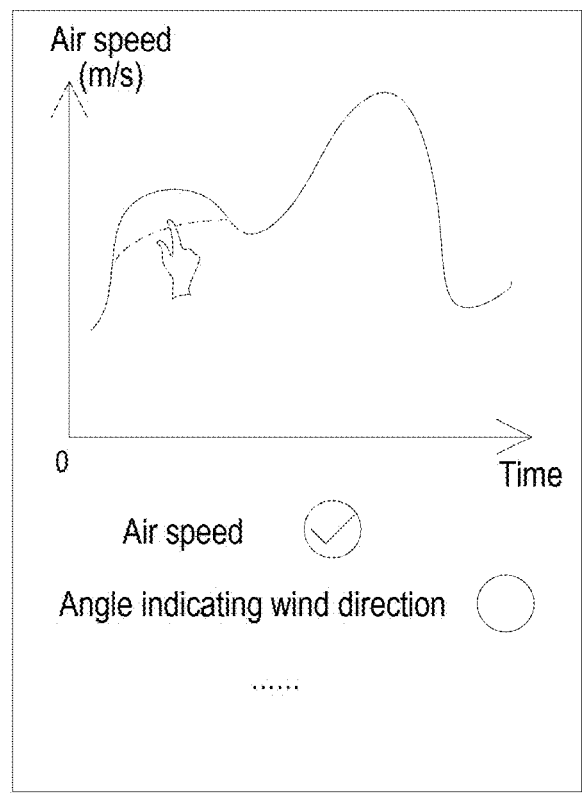
FIG. 4 illustrates a second example of an operation data adjustment interface.

By way of example, FIG. 4 shows an operation data adjustment interface in which the user has selected to display the historical air speed parameter of the air-out device 110. As illustrated in FIG. 4, the operation data adjustment interface may present an interactive chart that plots the historical air-speed of the air-out device 110 over a particular time period. As can be seen, the curve represents the output air speed of the air-out device 110 over the past 30 minutes. Once the historical air-speed curve has been displayed, the user may be able to modify the trajectory of the curve by performing a sliding operation using the terminal device 150. The air-out device control application may also prompt the user 101 to confirm any changes that they make. The modified curve may define the air speed parameter for the next 30 minutes, and may be used to generate an operation data file that may be sent to the air-out device 110, either automatically or at the instruction of the user 101.

In some embodiments, the operation data adjustment interface may allow the user 101 to define the operation parameters for the air-out device 110 without reference to the historical operation data. The operation data adjustment interface, for example, may provide an interactive graph or chart on which the user 101 may draw, or otherwise define, the value of an operation parameter for a future time period. The interactive graph, for instance, may include a first axis (e.g., the horizontal axis) that represents time and a second axis (e.g., the vertical axis) that represents the operation parameter value, and the user 101 may be able to draw, or otherwise plot, a curve representative of the particular operation parameter. The user 101, for example, may be able to perform a sliding operation to trace the trajectory of the curve or perform a series of tapping operations to define the curve in a pointwise manner. The user 101 may be able to select and/or switch between the operation parameter that is being defined (e.g., by selecting a particular operation parameter from a drop-down list provided in the operation data adjustment interface), and in this way, the user 101 may be able to define each operation parameter of the air-out device 110. The interactive chart may automatically change the unit of measure of the axes based on the parameter that is being defined (e.g., switching the vertical axis from m/s to degrees depending on whether the air speed or angle of wind direction is selected), and the user 101 may be able to adjust the scale of the axes of the interactive chart (e.g., adjusting the period of time covered by the interactive chart to cover a particular time period). The curves that are created by the user 101 may be used to define the operation parameters of the air-out device 110 over a particular future time period (e.g., for the next 30 minutes), and may be used to generate an operation data file that may be sent to the air-out device 110 as described above.

Figure 5:
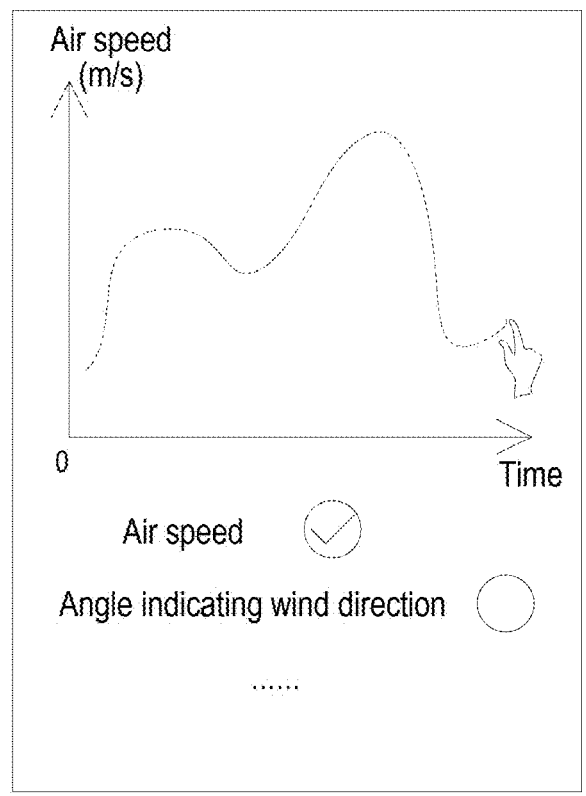
FIG. 5 illustrates a third example of an operation data adjustment interface.

By way of example, FIG. 5 shows an operation data adjustment interface in which the user has chosen to define air speed parameter of the air-out device 110. As illustrated in FIG. 5, the operation data adjustment interface may present an interactive chart on which the user may define an air speed parameter for a future time period. FIG. 5 illustrates the curve traced by the user 101 in a sliding operation, which represents the output air speed of the air-out device 110. The curve may define the air speed parameter for the next 30 minutes, and may be used to generate an operation data file that may be sent to the air-out device 110, either automatically or at the instruction of the user 101.

A user 101 may also be able to adjust the operation parameters of the air-out device 110 to simulate the climate of different geographical regions, which may have unique wind conditions, by selecting a theme pack through the user interface presented to the user 101 on the terminal device 150. Each of the theme packs may include an operation data file defining operation parameters (e.g., a wind speed, an angle of wind direction, or the like) associated with the environment in a particular geographic region, as well as introductory information providing a general description regarding the theme pack. By way of example, there may be a theme pack called "Maldives Wind", a theme pack called "Siberia Wind", a theme pack called "Sri Lanka Wind", a theme pack called "North Pole Wind", or the like, which may contain operation data files and introductory information corresponding to the respective climates (i.e., the climate in the Maldives, Siberia, Sri Lanka, the North Pole, or the like). In some embodiments, the theme packs may also refer to general climate categories, for example, including a "Tropical" theme pack, a "Desert" theme pack, or the like. By allowing a user 101 to adapt the operation parameters of the air-out device 110 so as to simulate the climate, including the wind, in a particular region, a user 101 may be able to experience the feel of these different regions.

Figure 7:
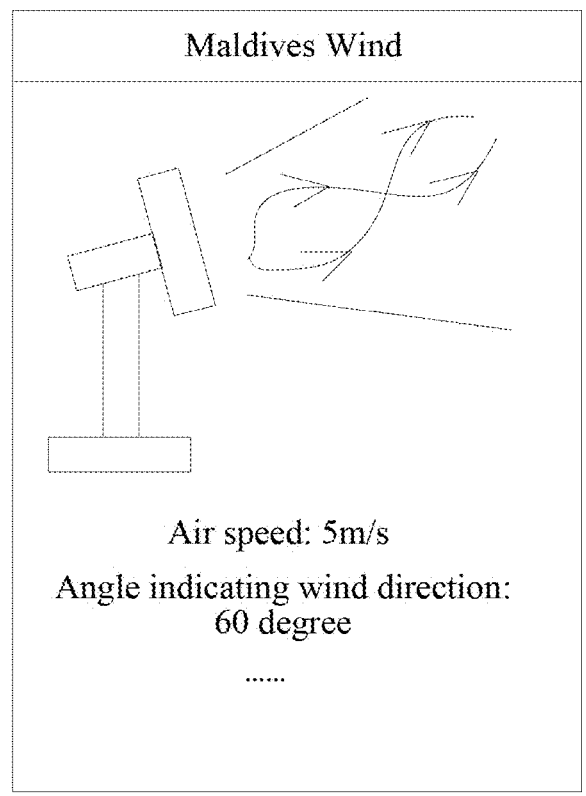
FIG. 7 illustrates an example of a theme pack selection interface.

The air-out device control application executed by the user 101 on the terminal device 150 may provide the user 101 with a theme pack selection interface through which the user 101 may be able to select a theme pack for use by the air-out device 110. In presenting the theme pack selection interface, the terminal device 150 may generate a theme pack list identifying theme packs that have been downloaded to the terminal device 150. The terminal device 150 may generate the list of downloaded theme packs based on the introductory information associated with each theme pack, and present the list of downloaded theme packs to the user 101 through the theme pack selection interface. The theme pack selection interface, for example, may present the introductory information for each downloaded theme pack along with corresponding interface interaction elements, which the user may select to affect operation of the air-out device 110 according to the operation data file associated with the theme pack. The terminal device 150, for example, may extract the operation data file from the theme pack and once extracted, may send the operation data file to the air-out device 110. As noted above, the air-out device may be provided with a communication module (e.g., a WiFi module), allowing the air-out device 110 to receive the operation data file sent from the terminal device 150 via its own communication module (e.g., a WiFi module). The air-out device 110 may also provide the terminal device 150 with an acknowledgement message that acknowledges receipt and processing of the operation data file by the air-out device 110. In the acknowledgement message, the air-out device 110 may indicate the theme and corresponding operation parameters that are currently being used by the air-out device 110, which the terminal device may present to the user through the user interface. By way of example, FIG. 7 shows the operation parameters currently in use by the air-out device 110 that correspond to a "Maldives Wind" theme pack, which was selected through the theme pack selection interface.

As noted above, an operation data file may include region information, which in some embodiments, may be used by the terminal device 150 to define the operation parameters provided to the air-out device 110. By way of example, a user may select a theme pack entitled "Maldives Wind," which may include region information within its corresponding operation data file (e.g., the longitude and latitude coordinates for the Maldives). When the theme pack is selected by the user through the theme pack selection interface, the terminal device 150 may extract the region information contained within the operation data file and obtain the current weather information for the particular region (i.e., the current weather in the Maldives). The terminal device 150 may contact a third-party information server 130 for such information. The weather information returned by the third-party information server 130 may include a temperature value, which the terminal device 150 may use to define the temperature parameter that is sent to the air-out device 110. The air-out device 110, in turn, may operate a temperature adjustment device 115*a* associated with the air-out device 110 so as to adjust the temperature of the indoor environment (i.e., the environment which the air-out device 110 is manipulating) to match the current local temperature of the Maldives. The terminal device 150 may also determine that the Maldives are an archipelago country on the Indian Ocean and may identify a video of a beautiful beach (maybe even a beach in the Maldives) along with audio of the wind or crashing waves, which the terminal device 150 may provide to the air-out device 110 for control of the audio and video playback device 115*d*. The weather information may additionally include a current oxygen concentration value of the Maldives, which the terminal device 150 may use to define an oxygen concentration parameter that is sent to the air-out device 110. The air-out device 110, in turn, may adjust operation of the oxygen generation device 115*c* so as to adjust the oxygen concentration of the indoor environment to match the current oxygen concentration level of the Maldives.

Figure 6:
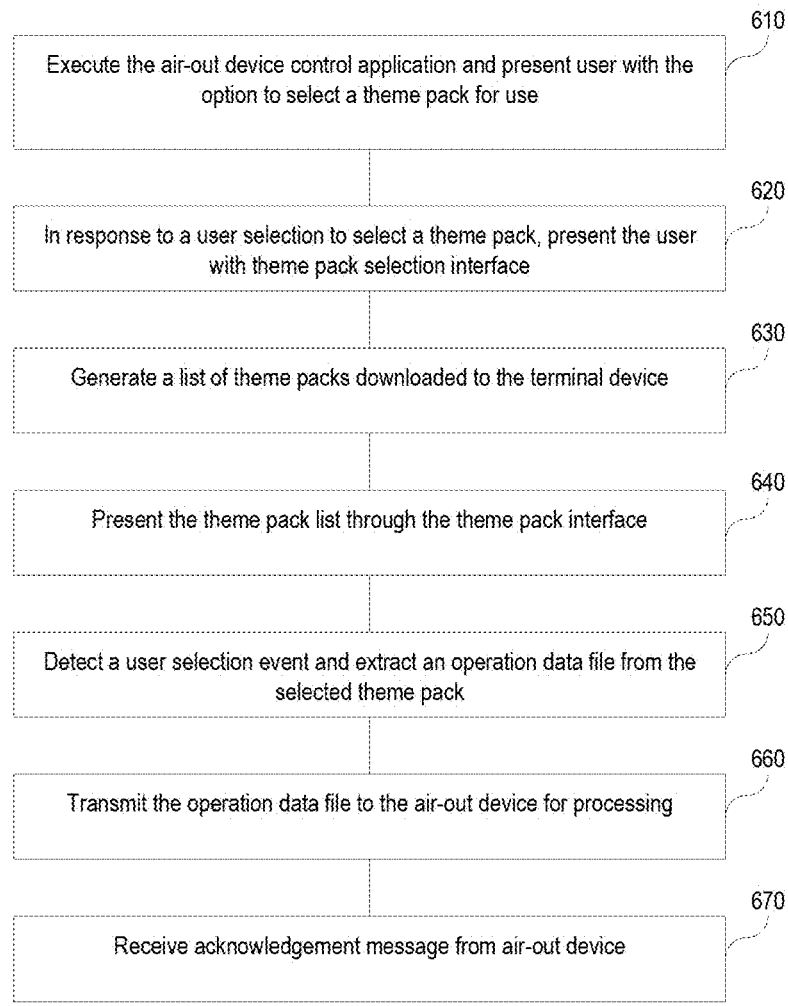
FIG. 6 illustrates an example of the logic that may be employed by the terminal device to facilitate selection of a theme pack.

FIG. 6 illustrates an example of the logic that may be employed by the terminal device 150 to facilitate selection of a theme pack by a user 101. A user 101 may execute the air-out device control application on the terminal device 150, which may present the user with the option to select a theme pack for use with an air-out device (610). In response to a user selection to select a theme pack, the terminal device 150 may present the user 101 with a theme pack selection interface (620). The air-out device control application may generate a theme pack list of theme packs downloaded to the terminal device 150 (630), and may present the theme pack list to the user 101 through the theme pack interface (640). The downloaded theme pack list may be generated using the introductory information associated with each of the downloaded theme packs. In some embodiments, the downloaded theme pack list may be generated and/or updated each time a user 101 choose to display or view the theme pack interface. In other embodiments, the downloaded theme pack list may be generated and/or updated when a theme pack is first downloaded (e.g., by creating a downloaded theme pack list or adding newly downloaded them packs to an existing theme pack list). Each item in the theme pack list may include the introduction information of each of the downloaded theme packs and corresponding interface interaction elements which may be selected by the user 101 to adjust operation of the air-out device 110 (e.g., by tapping or clicking on a "Select Theme Pack for Use" button). When a selection instruction or event is detected, the terminal device 150 may determine the theme pack that was selected by the user, and may extract an operation data file from the theme pack (650). Once extracted, the terminal device 150 may transmit the operation data file to the air-out device 110 for processing (660). The terminal device 150 may receive an acknowledgment message from the air-out device 110 that acknowledges receipt and processing of the operation data file by the air-out device 110 (670).

In some embodiments, the air-out device control application executed by the user 101 on the terminal device 150 may also be used to obtain the theme packs, for example, by automatically downloading different theme packs or allowing the user 101 to manually select different theme packs for download. In some embodiments, the terminal device 150 can download the theme packs from an information server 130, which may store one or more theme packs in a theme pack database or repository. The theme packs stored on the information server 130 may be provided by relevant operators, who may be responsible for uploading the theme packs to the information server 130. The theme packs may also be provided through the user community, where users can create their own theme packs (e.g., theme packs representative of the current conditions in their particular region, or theme packs representative of their own preferences) and upload the theme packs to the information server 130, for example, via the air-out device control application operating on the terminal device 150. In this way, different users 101 may be able to share a common experience and connect with one another.

Figure 8:
FIG. 8 illustrates an example of a theme pack download interface.

The information server 130 may allow users to access the theme packs through an online portal (e.g., an online storefront or website), which may be integrated into the air-out device control application, for example, through a theme pack download interface, which may be presented based on a user selection (e.g., a user may tap or click on a "Obtain Theme Pack" button). The theme pack download interface may be able to request a theme pack list from the information server 130, which may identify one or more theme packs that are available for download and provide introductory information regarding the themes that they represent (i.e., the particular geographic region or user experience). The information server 130 may generate the list of available theme packs based on the introductory information corresponding to each of the theme packs available for download. The information server 130 may generate and update the theme pack list automatically as each of the theme packs are uploaded, periodically at specific intervals of time, or in response to a request for a theme pack list received from a terminal device. The information server 130 may send the generated theme pack list to the terminal device 150 in response to the request, which may be presented to the user via the theme pack download interface. The theme pack download interface, for example, may identify each theme pack in the list and present the introductory information for each theme pack along with a corresponding interface interaction element, which the user may select to download the associated theme pack from the information server 130. By way of example, FIG. 8 shows a theme pack download interface identifying several theme packs available for download, namely "Maldives Wind," "Siberian Wind," "Sri Lanka Wind," and "North Pole Wind" theme packs, along with corresponding "Download" interaction elements. The theme pack download interface may additionally include an interaction element that would load additional theme packs from the theme pack list.

Figure 10:
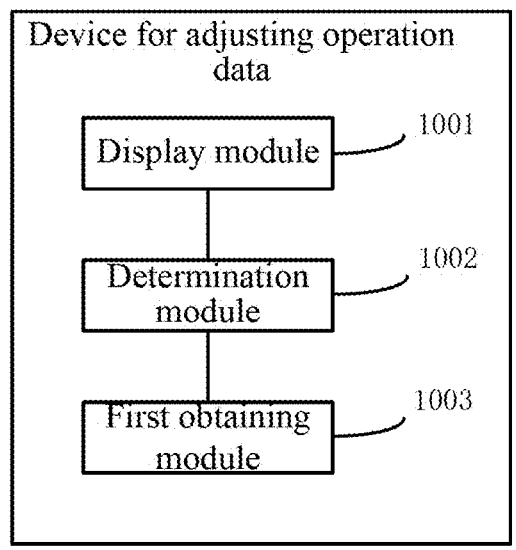
FIG. 10 is a block diagram showing a device for adjusting operation data according to an exemplary embodiment.

FIG. 10 is a block diagram showing a device for adjusting operation data according to an exemplary embodiment. The device for adjusting operation data is applied in a terminal. As shown in FIG. 10, the device includes a display module 1001, a determination module 1002 and a first obtaining module 1003.

The display module 1001 is configured to, when an instruction for displaying a theme pack list is detected, display the theme pack list on an application interface, wherein the theme pack list includes introductory information of at least one theme pack, and each theme pack contains operation data which is edited in advance.

The determination module 1002 is configured to, when a selection instruction on the theme pack list by a user is detected, determine a theme pack which is selected by the user according to the selection instruction.

The first obtaining module 1003 is configured to obtain the operation data in the selected theme pack to enable an air-out device to output air according to the operation data, wherein the operation data includes at least an air speed and an angle indicating wind direction.

Figure 11:
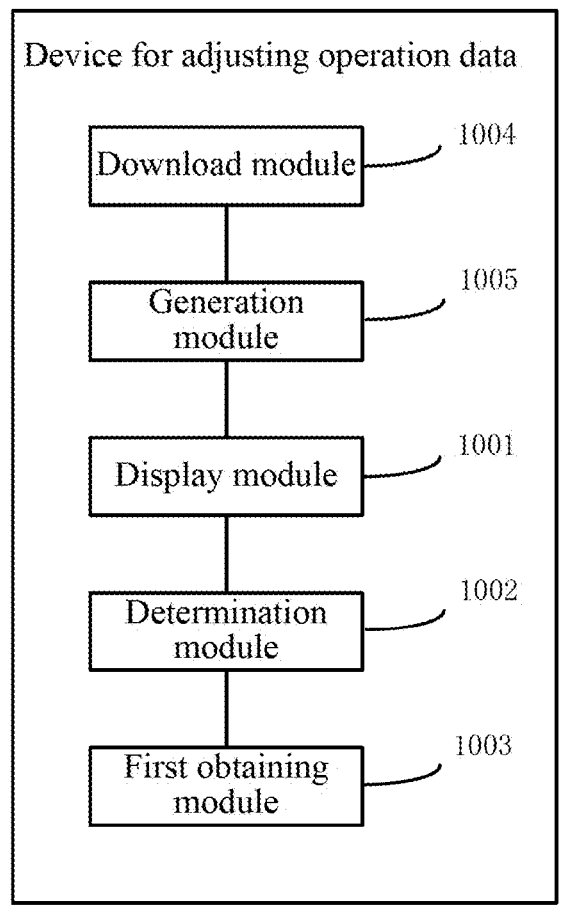
FIG. 11 is a block diagram showing a device for adjusting operation data according to an exemplary embodiment.

In an embodiment, as shown in FIG. 11, the device further includes a download module 1004 and a generation module 1005.

The download module 1004 is configured to download theme packs of different kinds and corresponding introductory information.

The generation module 1005 is configured to generate the theme pack list according to the introductory information of respective downloaded theme packs.

Figure 12:
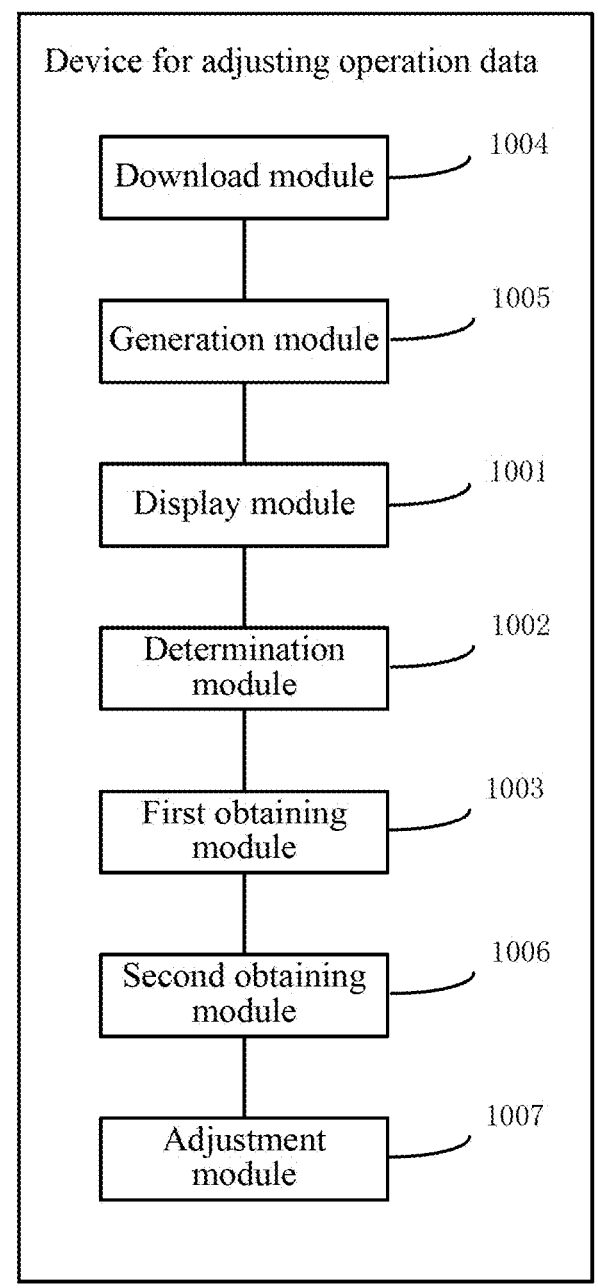
FIG. 12 is a block diagram showing a device for adjusting operation data according to an exemplary embodiment.

In an embodiment, as shown in FIG. 12, the device further includes a second obtaining module 1006 and an adjustment module 1007.

The second obtaining module 1006 is configured to obtain region information corresponding to the theme pack selected by the user.

The adjustment module 1007 is configured to, according to the region information, adjust an auxiliary device of the air-out device, wherein the auxiliary device includes at least a temperature adjustment device.

Figure 13:
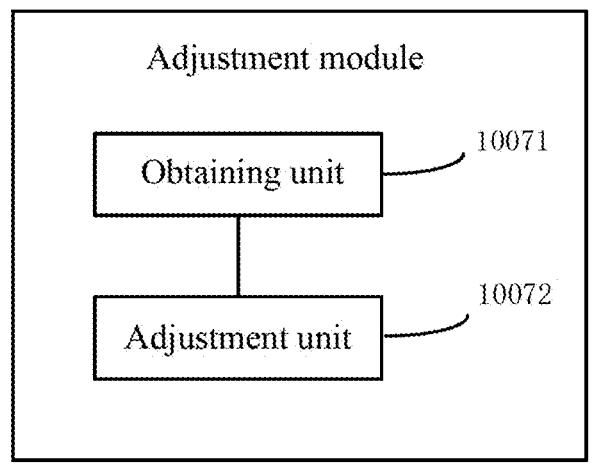
FIG. 13 is a block diagram showing an adjustment module according to an exemplary embodiment.

In an embodiment, as shown in FIG. 13, the adjustment module 1007 includes an obtaining unit 10071 and an adjustment unit 10072.

The obtaining unit 10071 is configured to obtain current weather information of a region corresponding to the region information, wherein the weather information includes at least a temperature value.

The adjustment unit 10072 is configured to, according to the weather information, adjust the auxiliary device.

In an embodiment, when the auxiliary device is the temperature adjustment device, the adjustment unit 10072 is configured to send the temperature value in the weather information to the temperature adjustment device to enable the temperature adjustment device to adjust temperatures based on the temperature value, and when the auxiliary device is an oxygen generation device, the adjustment unit 10072 is configured to send an oxygen concentration value in the weather information to the oxygen generation device to enable the oxygen generation device to adjust oxygen concentrations based on the oxygen concentration value.

In the device provided by embodiments of the present disclosure, by displaying a theme pack list on an application interface, when detecting a selection instruction on the theme pack list by a user, a theme pack which is selected by the user is determined according to the selection instruction; and the operation data in the selected theme pack is obtained to enable an air-out device to output air according to the operation data. Users can select theme packs of different kinds to make the air-out device adjust the operation data according to the theme packs of different kinds, and then the air-out device can output air following corresponding air-out manners. Thus, there are provided diversified air-out manners, and the air-out device can output air according to users' demands. Consequently, better air-out effects can be achieved when the operation data is adjusted.

Figure 14:
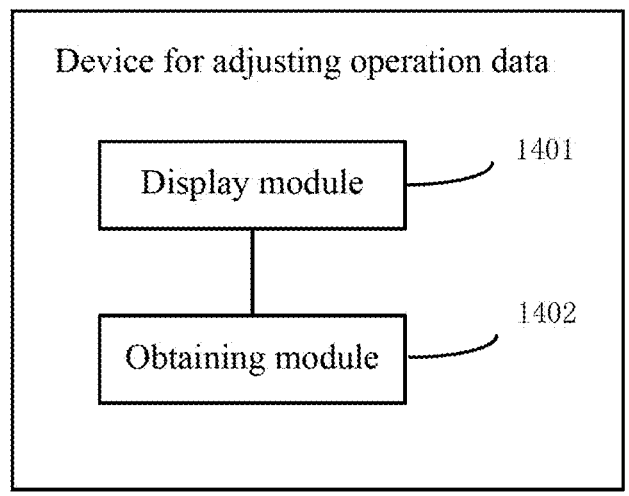
FIG. 14 is a block diagram showing a device for adjusting operation data according to an exemplary embodiment.

FIG. 14 is a block diagram showing a device for adjusting operation data according to an exemplary embodiment. The device for adjusting operation data is applied in a terminal. As shown in FIG. 14, the device includes a display module 1401 and an obtaining module 1402.

The display module 1401 is configured to, when an instruction for adjusting operation data is detected, display an operation data adjustment interface which is configured to adjust an air speed and an angle indicating wind direction of an air-out device.

The obtaining module 1402 is configured to, according to an operation on the operation data adjustment interface performed by a user, obtain first operation data to enable the air-out device to output air according to the first operation data.

Figure 15:
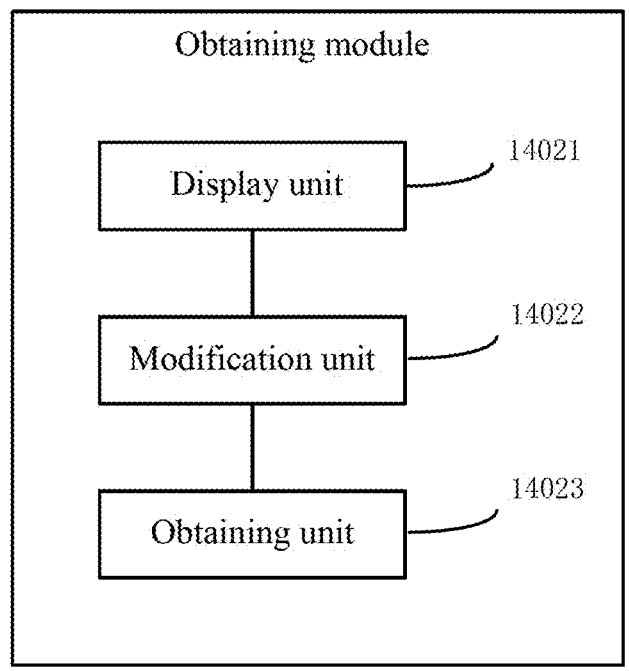
FIG. 15 is a block diagram showing a first obtaining module according to an exemplary embodiment.

In an embodiment, as shown in FIG. 15, the obtaining module 1402 includes a display unit 14021, a modification unit 14022 and an obtaining unit 14023.

The display unit 14021 is configured to display on the operation data adjustment interface coordinate axes of the operation data, among which a horizontal axis represents the time and a vertical axis represents the operation data, wherein a first curve is plotted in a coordinate system formed by the coordinate axes of the operation data, and the first curve indicates changes of the operation data in a historical time period.

The modification unit 14022 is configured to, when a sliding operation on the first curve by the user is detected, modify a trajectory of the first curve according to the sliding operation.

The obtaining unit 14023 is configured to, according to the modified trajectory of the first curve, obtain the first operation data.

Figure 16:
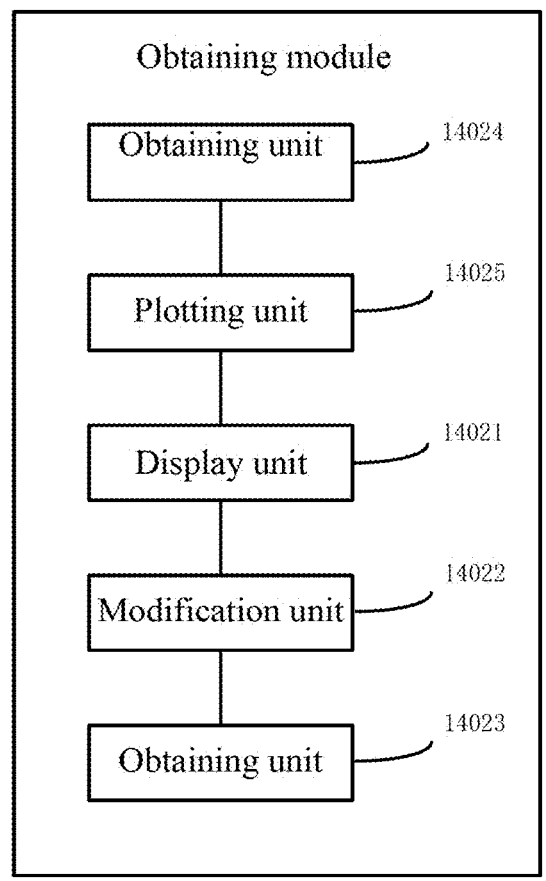
FIG. 16 is a block diagram showing a second obtaining module according to an exemplary embodiment.

In an embodiment, as shown in FIG. 16, the obtaining module further includes an obtaining unit 14024 and a plotting unit 14025.

The obtaining unit 14024 is configured to obtain operation data of the air-out device in the historical time period.

The plotting unit 14025 is configured to, according to the operation data in the historical time period, plot the first curve indicating changes of the operation data in the coordinate system formed by the coordinate axes of the operation data.

In an embodiment, the obtaining module 1402 is configured to: display on the operation data adjustment interface coordinate axes of the operation data, among which a horizontal axis represents the time and a vertical axis represents the operation data; when a sliding operation in a coordinate system formed by the coordinate axes of the operation data performed by the user is detected, plot in the coordinate system a second curve which indicates changes of the operation data in a future time period according to the sliding operation; and according to a trajectory of the second curve, obtain the first operation data.

In an embodiment, the obtaining module 1402 is configured to: obtain second operation data indicating current operation status of the air-out device; display the second operation data on the operation data adjustment interface; and when an operation for modifying the second operation data by the user is detected, obtain the first operation data which is resulted from modification of the second operation data.

In the device provided by embodiments of the present disclosure, by displaying an operation data adjustment interface, according to an operation on the operation data adjustment interface performed by a user, first operation data is obtained to enable the air-out device to output air according to the first operation data. Users can adjust operation data on the operation data adjustment interface, and thus according to the adjusted operation data, the air-out device can output air following the corresponding air-out manners. Thus, there are provided diversified air-out manners, and the air-out device can output air according to users' demands. Consequently, better air-out effects can be achieved when the operation data is adjusted.

With respect to the devices in the above embodiments, the specific manners for performing operations for individual modules therein have been described in detail in the embodiments regarding the methods, which will not be elaborated herein.

Other embodiments of the invention will be apparent to those skilled in the art from consideration of the specification and practice of the invention disclosed here. This application is intended to cover any variations, uses, or adaptations of the invention following the general principles thereof and including such departures from the present disclosure as come within known or customary practice in the art. It is intended that the specification and examples be considered as exemplary only, with a true scope and spirit of the invention being indicated by the following claims.

It will be appreciated that the present invention is not limited to the exact construction that has been described above and illustrated in the accompanying drawings, and that various modifications and changes can be made without departing from the scope thereof. It is intended that the scope of the invention only be limited by the appended claims.

What is claimed is:

1. A method for adjusting an operation parameter of an air-out device, comprising:
   presenting, on a terminal device of a user, an interface interaction element for adjusting the operation parameter of the air-out device, the operation parameter comprising an air speed and a wind direction angle;
   presenting, on the terminal device, an operation data adjustment interface for adjusting the operation parameter of the air-out device in response to a user selection of the interface interaction element for adjusting the operation parameter of the air-out device;
   obtaining, by the terminal device, an adjusted operation parameter of the air-out device, wherein the obtaining the adjusted operation parameter of the air-out device comprises:
     displaying, on the terminal device, an interactive chart including a first curve representing a historical value of the operation parameter over a time period, wherein the interactive chart allows the user to manipulate a trajectory of the first curve,
     when detecting a sliding operation on the first curve, modifying the trajectory of the first curve in accordance with the sliding operation, and
     determining the adjusted operation parameter over a future time period represented by the modified trajectory of the first curve;
   generating, by the terminal device, an adjusted operation data file based on the adjusted operation parameter that is obtained; and
   transmitting, by the terminal device, the adjusted operation data file to the air-out device.

2. The method according to claim 1, further comprising:
   requesting, by the terminal device from the air-out device, the historical value of the operation parameter over t past time period; and
   plotting the first curve on the interactive chart, wherein a horizontal axis represents the time period and a vertical axis represents the operation parameter of the air-out device.

3. The method according to claim 1, wherein the obtaining the adjusted operation parameter of the air-out device comprises:
   displaying, on the terminal device, an interactive chart, wherein the interactive chart allows the user to trace a trajectory of a second curve;

when detecting a sliding operation on the interactive chart, determining, by the terminal device, a trajectory traced by the user; and determining, by the terminal device, the adjusted operation parameter over a future time period represented by the trajectory of the second curve traced by the user.

4. The method according to claim 1, wherein obtaining the adjusted operation parameter of the air-out device comprises:

obtaining a current operation parameter value of the air-out device;

displaying the current operation parameter value on the operation data adjustment interface; and detecting a change in the current operation parameter and determining the changed current operation parameter to be the adjusted operation parameter.

5. A method for adjusting operation parameters of an air-out device, comprising:

presenting, on a terminal device of a user, an interface interaction element for selecting a theme pack for use with the air-out device;

presenting, on the terminal device, a theme pack selection interface for adjusting the operation parameter of the air-out device in response to a user selection of the interface interaction element for selecting the theme pack for use with the air-out device, further comprising:

presenting, on the terminal device, a theme pack list comprising introductory information for one or more downloaded theme packs along with corresponding interface interaction elements, wherein each theme pack comprises an operation data file comprising operation parameters for the air-out device;

in response to a selection of a particular interface interaction element, extracting, by the terminal device, the operation data file from the theme pack associated with the particular interface interaction element;

generating, by the terminal device, adjusted operation parameters for the air-out device based on the extracted operation data file, wherein generating the adjusted operation parameters for the air-out device based on the extracted operation data file further comprises:

extracting, by the terminal device, region information from the operation data file, the region information corresponding to a location corresponding to the theme pack, generating, by the terminal device, adjusted operation parameters for one or more auxiliary devices associated with the air-out device based on the extracted region information, and transmitting, by the terminal device, the adjusted operation parameters for the one or more auxiliary devices to the air-out device; and transmitting, by the terminal device, the adjusted operation parameters to the air-out device.

6. The method according to claim 5, further comprising:

downloading, by the terminal device, one or more theme packs from an information server; and generating, by the terminal device, the theme pack list according to the introductory information associated with each of the downloaded theme packs.

7. The method according to claim 5, wherein generating operation parameters for one or more auxiliary devices associated with the air-out device further comprises:

obtaining, by the terminal device from an information server, current weather information of a region corresponding to the region information;

generating operation parameters for the one or more auxiliary devices associated with the air-out device based on the weather information that is obtained; and transmitting, by the terminal device, the adjusted operation parameters for the one or more auxiliary devices to the air-out device.

8. The method according to claim 7, wherein the weather information comprises a temperature value and an oxygen concentration value, wherein the one or more auxiliary devices comprise a temperature adjuster and an oxygen generator, and wherein the operation parameters for the one or more auxiliary devices comprise a temperature parameter to enable the temperature adjuster to adjust a temperature and an oxygen concentration value to enable the oxygen generator to adjust an oxygen concentration.

9. A terminal device, comprising:

a processor; and a memory for storing instructions executable by the processor;

wherein the processor is configured to:

present an interface interaction element for adjusting an operation parameter of an air-out device, the operation parameter comprising an air speed and a wind direction angle;

present an operation data adjustment interface for adjusting the operation parameter of the air-out device in response to a user selection of the interface interaction element for adjusting the operation parameter of the air-out device;

obtain an adjusted operation parameter of the air-out device by:

displaying an interactive chart including a first curve representing a historical value of the operation parameter over a time period, wherein the interactive chart allows the user to manipulate a trajectory of the first curve, when a sliding operation on the first curve is detected, modifying the trajectory of the first curve in accordance with the sliding operation, and determining the adjusted operation parameter over a future time period represented by a modified trajectory of the first curve;

generate an adjusted operation data file based on the adjusted operation parameter that is obtained; and transmit the adjusted operation data file to the air-out device.

10. The terminal according to claim 9, wherein the processor is further configured to:

request the historical value of the operation parameter over a past time period from the air-out device; and plot the first curve on the interactive chart, wherein a horizontal axis represents the time period and a vertical axis represents the operation parameter of the air-out device.

11. The terminal according to claim 9, wherein in obtaining the adjusted operation parameter of the air-out device the processor is configured to:

display an interactive chart, wherein the interactive chart allows the user to trace a trajectory of a second curve;

when a sliding operation on the interactive chart is detected, determine a trajectory traced by the user; and determine the adjusted operation parameter over a future time period represented by the trajectory of the second curve traced by the user.

12. The terminal according to claim 9, wherein in obtaining the adjusted operation parameter of the air-out device the processor is configured to:

obtain a current operation parameter value of the air-out device;

display the current operation parameter value on the operation data adjustment interface; and detect a change in the current operation parameter and determining the changed current operation parameter to be the adjusted operation parameter.

13. A terminal device, comprising:

a processor; and a memory for storing instructions executable by the processor;

wherein the processor is configured to:

present an interface interaction element for selecting a theme pack for use with the air-out device;

present a theme pack selection interface for adjusting the operation parameter of the air-out device in response to a user selection of the interface interaction element for selecting the theme pack for use with the air-out device, wherein the processor is further configured to:

present a theme pack list comprising introductory information for one or more downloaded theme packs along with corresponding interface interaction elements, wherein each theme pack comprises an operation data file comprising operation parameters for the air-out device;

in response to a selection of a particular interface interaction element, extract the operation data file from the theme pack associated with the particular interface interaction element;

generate adjusted operation parameters for the air-out device based on the extracted operation data file by:

extracting region information from the operation data file, the region information corresponding to a location corresponding to the theme pack, generating adjusted operation parameters for one or more auxiliary devices associated with the air-out device based on the extracted region information, and transmitting the adjusted operation parameters for the one or more auxiliary devices to the air-out device; and transmit the adjusted operation parameters to the air-out device.

14. The terminal according to claim 13, wherein the processor is further configured to:

download one or more theme packs from an information server; and generate the theme pack list according to the introductory information associated with each of the downloaded theme packs.

15. The terminal according to claim 13, wherein in generating operation parameters for one or more auxiliary devices associated with the air-out device the processor is further configured to:

obtain current weather information of a region corresponding to the region information from an information server;

generate operation parameters for the one or more auxiliary devices associated with the air-out device based on the weather information that is obtained; and transmit the adjusted operation parameters for the one or more auxiliary devices to the air-out device.

16. The terminal according to claim 15, wherein the weather information comprises a temperature value and an oxygen concentration value, wherein the one or more auxiliary devices comprise a temperature adjuster and an oxygen generator, and wherein the operation parameters for the one or more auxiliary devices comprise a temperature parameter to enable the temperature adjuster to adjust a temperature and an oxygen concentration value to enable the oxygen generator to adjust an oxygen concentration.

* * * * *